United States Patent
Xie et al.

(10) Patent No.: US 12,176,404 B2
(45) Date of Patent: Dec. 24, 2024

(54) WRAP-AROUND CONTACT FOR NANOSHEET DEVICE

(71) Applicant: International Business Machines Corporation, Armonk, NY (US)

(72) Inventors: Ruilong Xie, Niskayuna, NY (US); Oleg Gluschenkov, Tannersville, NY (US); Andrew M. Greene, Slingerlands, NY (US); Pietro Montanini, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 644 days.

(21) Appl. No.: 17/484,839

(22) Filed: Sep. 24, 2021

(65) Prior Publication Data

US 2023/0099985 A1    Mar. 30, 2023

(51) Int. Cl.
*H01L 29/417* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/41733* (2013.01); *H01L 29/0665* (2013.01); *H01L 29/42392* (2013.01); *H01L 29/66545* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,379,025 B1 | 6/2016 | Basker et al. | |
| 9,425,310 B2 | 8/2016 | Yang | |
| 9,443,769 B2 | 9/2016 | Wang et al. | |
| 9,847,390 B1* | 12/2017 | Xie | H01L 29/78684 |
| 9,997,631 B2 | 6/2018 | Yang et al. | |
| 10,177,031 B2 | 1/2019 | Bao et al. | |
| 10,192,867 B1* | 1/2019 | Frougier | H01L 21/823828 |
| 10,276,442 B1* | 4/2019 | Xie | H01L 21/823807 |
| 2015/0056800 A1 | 2/2015 | Mebarki et al. | |
| 2016/0104771 A1* | 4/2016 | Aderhold | H01L 29/42392 257/369 |
| 2017/0352762 A1* | 12/2017 | Yang | H01L 29/0847 |
| 2018/0219077 A1 | 8/2018 | Wang et al. | |

(Continued)

OTHER PUBLICATIONS

S.-A. Chew et al., "Ultralow Resistive Wrap Around Contact to Scaled FinFET Devices by Using ALD-Ti Contact Metal," IEEE International Interconnect Technology Conference (IITC), May 16-18, 2017, 3 pages.

*Primary Examiner* — Ali Naraghi
*Assistant Examiner* — E. Rhett Cheek
(74) *Attorney, Agent, or Firm* — Samuel Waldbaum; Ryan, Mason & Lewis LLP

(57) ABSTRACT

A semiconductor structure comprises a substrate defining a first axis and a second axis in orthogonal relation to the first axis, first and second nanosheet stacks disposed on the substrate, a gate structure on each of the first and second nanosheet stacks, a source/drain region adjacent each of the first and second nanosheet stacks, a wrap-around contact disposed about each source/drain region and an isolator pillar disposed between the wrap-around contacts.

20 Claims, 11 Drawing Sheets

(56) References Cited

U.S. PATENT DOCUMENTS

| | | | |
|---|---|---|---|
| 2018/0269305 A1 | 9/2018 | Bao et al. | |
| 2019/0341448 A1* | 11/2019 | Bourjot | H01L 29/775 |
| 2020/0105889 A1* | 4/2020 | Liaw | H01L 21/823418 |
| 2020/0119180 A1* | 4/2020 | Frougier | H01L 21/823418 |
| 2020/0312980 A1* | 10/2020 | Frougier | H01L 29/775 |
| 2024/0312786 A1* | 9/2024 | Wang | H01L 21/28518 |

* cited by examiner

WRAP-AROUND CONTACT FOR NANOSHEET DEVICE

BACKGROUND

Continued innovations in semiconductor process technologies are enabling higher integration densities and associated device scaling. As the semiconductor industry moves towards the 5 nanometer (nm) production node and beyond, field effect transistor (FET) devices must be scaled to smaller dimensions to provide an increased effective channel width per footprint area. Such scaling in some cases is achieved using nanosheet FET devices. A given nanosheet FET device comprises a channel which includes multiple nanosheet layers arranged in a stacked configuration, with each nanosheet layer having a vertical thickness that is substantially less than its width. A common gate structure is formed in areas wrapping around the nanosheet layers in the stacked configuration, thereby increasing the effective channel width of the resulting device, and thus the drive current supported thereby, for a given footprint area. Nanosheet technologies are considered to be a viable option for continued scaling of metal-oxide-semiconductor (MOS) devices, such as complementary MOS (CMOS) devices each comprising an N-type FET (nFET) and a P-type FET (pFET). However, problems can arise in the production of nanosheet device features, particularly, at production nodes below 5 nm. For example, one challenge of fabricating nanosheet FET devices is forming a wrap-around contact with low contact resistance while minimizing tip-to-tip-shorting.

Current manufacturing techniques for nanosheet FET devices employ a wrap-around contact over the surfaces of the source/drain regions in an attempt to minimize resistance in these devices. However, due to minimized scaling of FET nanosheet devices, the ability to access the device components for application of various processes which would enhance the functionality of the wrap-around contacts and the overall usefulness of the FET nanosheet device is greatly restricted.

SUMMARY

Accordingly, illustrative embodiments provide techniques for use in fabrication of nanosheet FET structures.

In accordance with one illustrative embodiment, a semiconductor structure comprises a substrate defining a first axis and a second axis in orthogonal relation to the first axis, first and second nanosheet stacks disposed on the substrate, a gate structure on each of the first and second nanosheet stacks, a source/drain region adjacent each of the first and second nanosheet stacks, a wrap-around contact disposed about each source/drain region and an isolator pillar disposed between the wrap-around contacts.

In another illustrative embodiment, a semiconductor structure comprises a substrate, first and second nanosheet stacks disposed on the substrate, a gate structure on each of the first and second nanosheet stacks, a source/drain region adjacent each of the first and second nanosheet stacks, a wrap-around contact disposed about each source/drain region and a liner disposed on portions of the wrap-around contact, where the liner comprising a metal-based silicide.

In yet another illustrative embodiment, a method comprises forming first and second nanosheet stacks on a substrate, forming a gate structure about each of the first and second nanosheet stacks, forming a source/drain region adjacent each of the first and second nanosheet stacks, forming a wrap-around contact disposed about each source/drain region, and forming an isolator pillar disposed between the wrap-around contacts.

Advantageously, illustrative embodiments provide a nanosheet FET structure including a wrap-around contact, source/drain region(s) and associated components, which exhibit a minimal resistance, particularly, contact resistance at various interfaces of the components of the FET nanosheet device.

These and other objects, features and advantages of the present disclosure will become apparent from the following detailed description of illustrative embodiments thereof, which is to be read in connection with the accompanying drawings.

DETAILED DESCRIPTION

Figure 1:
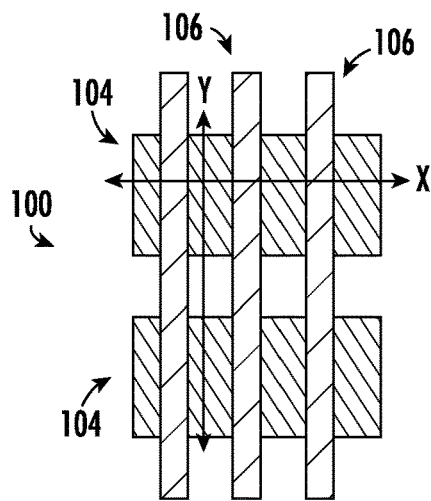
FIG. 1 is a plan view of a semiconductor structure according to one or more illustrative embodiments.

It is understood in advance that although this description includes a detailed description of an illustrative nanosheet FET architecture having channel nanosheets and sacrificial nanosheets, implementation of the teachings recited herein are not limited to the particular FET architecture described herein. Rather, embodiments of the present invention are capable of being implemented in conjunction with any other type of FET device, including, for example, any nanosheet FET architectures and transistor structures, FinFET devices and planar FET devices.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure or device according to illustrative embodiments utilize a variety of individually known physical and chemical processes performed on a semiconductor (e.g., silicon) substrate, some of which are described in the immediately following paragraphs.

In the discussion that follows, the semiconductor device, which will incorporate one or more nanosheet FET transistor structures or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in a different order or sequence. In addition, one or more processes may be incorporated within various intermediate stages as described herein, and one or more processes may be implemented in intermediate stages as otherwise described herein.

Figure 2:
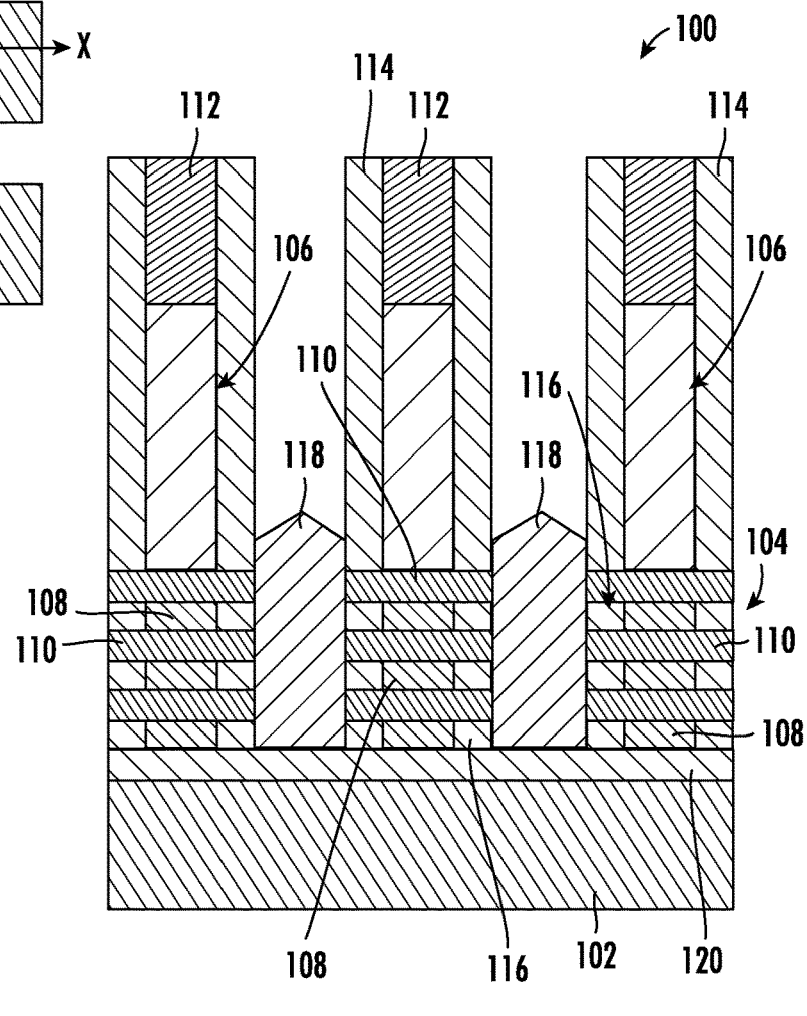
FIG. 2 is a cross-sectional view of the semiconductor structure taken along the lines X-X at a first intermediate stage of fabrication according to one or more illustrative embodiments.
Figure 3:
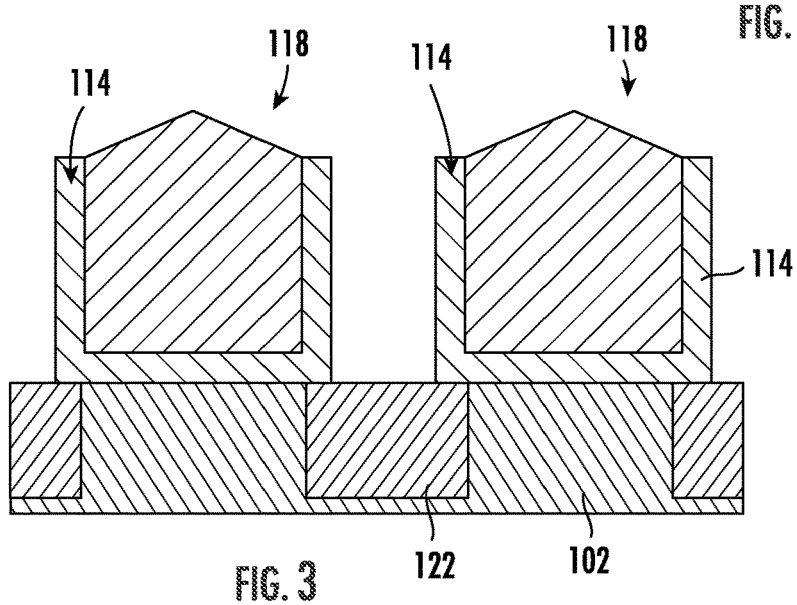
FIG. 3 is a cross-sectional view of the semiconductor structure taken along the lines Y-Y at the first intermediate stage of fabrication according to one or more illustrative embodiments.

FIG. 1 is a plan view of the semiconductor structure illustrating a pair of nanosheet stacks and one or more dummy gates extending across the nanosheet stacks. FIG. 2 is a cross-sectional view of the semiconductor structure 100 along lines X-X and FIG. 3 is a cross-sectional view of the semiconductor structure 100 along lines Y-Y of FIG. 1. The semiconductor substrate 100 includes a substrate or wafer 102, one or more nanosheet stacks 104 formed on the substrate 102 and a plurality of dummy gates 106 extending across the nanosheet stacks 104. The substrate 102 may include a silicon (Si) material or other dielectric material, such as silicon oxide or silicon nitride. In illustrative embodiments, the substrate 102 may have a thickness of about 500 to 1000 micrometers (μm). The substrate 102 may itself comprise multiple layers, although it is shown as a single layer in the figures, again for clarity and simplicity of illustration. The substrate 102 defines a first or longitudinal axis x and a second or orthogonal axis y extending orthogonal to longitudinal axis x.

The nanosheet stack 104 is formed as an alternating series of sacrificial nanosheets 108 and channel nanosheets 110. In illustrative embodiments, the sacrificial nanosheets 108 comprise silicon-germanium (SiGe) and the channel nanosheets 110 comprise silicon (Si). Other materials for the sacrificial nanosheets 108 and the channel nanosheets 110 are also contemplated. The sacrificial nanosheets 108 are "sacrificial" meaning they are substantially removed in subsequent processing steps. The channel nanosheets 110 will be the nanosheet layers of a nanosheet channel transistor structure. Although the nanosheet stack 104 is shown as including three sacrificial nanosheets 108 and three channel nanosheets 110, it should be understood that in other illustrative embodiments any number of sacrificial nanosheets 108 and channel nanosheets 110 may be used. In addition, any semiconductor material composition may be used for the sacrificial nanosheets 108 and the channel nanosheets 110 so long as at least one of the compositions selected allow for selective etching between at least two of them. More specifically, any type IV semiconductor composition combination and/or III-V semiconductor composition combination may be suitable. In addition, the thickness of the sacrificial nanosheets 108 is shown as being substantially equal. However, it is to be appreciated that the thicknesses of the sacrificial nanosheets 108 may vary with, for example, the lowermost sacrificial nanosheet proximate the substrate 102 being thicker than the remaining two sacrificial nanosheets 108. In illustrative embodiments, the thickness of the sacrificial nanosheets 108 and the channel nanosheets 110 may range from about 3 nanometers (nm) to about 30 nanometers (nm), and more particularly, may range from about 5 nanometers (nm) to about 20 nanometers (nm).

The sacrificial nanosheets 108 and the channel nanosheets 110 may be epitaxially grown in an alternating fashion in accordance with conventional methodologies. For example, the alternating series of silicon germanium (SiGe) sacrificial nanosheets 108 and silicon (Si) channel nanosheets 110 may be formed by epitaxially growing one layer and then the next until the desired number and desired thicknesses of the sacrificial and channel nanosheets 108, 110 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable processes. Epitaxial silicon (Si), silicon germanium (SiGe), and/or carbon doped silicon (Si: C) silicon can be undoped, or doped during deposition (in-situ doped) by adding dopants, n-type dopants (e.g., phosphorus or arsenic) or p-type dopants (e.g., boron or gallium), depending on the type of transistor. In illustrative embodiments, nanosheets 108 and 110 are undoped epitaxy layers. In illustrative embodiments, an additional sacrificial SiGe layer with a higher percentage of germanium (Ge) can be inserted between the substrate 102 and nanosheet stack 104, and later removed and replaced with a dielectric layer, e.g., a bottom dielectric isolation layer (BDI). For example, the additional sacrificial layer may comprise 55% germanium while the sacrificial nanosheets 108 may comprise about 20% to about 30% germanium. The etching process may be selected to remove the higher composition germanium sacrificial layer.

With continued reference to FIGS. 2 and 3, the dummy gates 106 are formed on the uppermost channel nanosheet 110, and along the sidewalls of the nanosheet stack 104 although not visible in the cross-sectional view of FIG. 3. The dummy gates 106 are each place holders subsequently removed and replaced with suitable gate materials to form functional gate structures. The dummy gates 106 may comprise any material that can be etched selectively to the materials of the sacrificial nanosheets 108 and the channel nanosheets 110. One suitable material for the dummy gates 106 includes a thin silicon dioxide (SiO2) layer which is conformally deposited over the nanosheet stacks 104 followed by deposition of a silicon material, such as polysilicon/amorphous silicon, or any dielectric material such as an oxide, nitride or oxynitride material. The dummy gates 106 may be formed using deposition (e.g., chemical vapor deposition) processes. A hard mask layer 112 may be formed on top of each dummy gate 106. The hard mask layer 112 may be formed of any suitable material, e.g., a silicon nitride (SiN) hard mask material. After hard mask deposition, gate patterning is performed by conventional lithography and etching processes, such that a plurality of gates is formed over the nanosheet stacks 104.

A gate spacer 114 is formed around each of the dummy gates 106 (and around the hard mask layers 112), and the sides of the nanosheet stacks 104. The gate spacers 114 may comprise a dielectric material, such as silicon boron carbide nitride (SiBCN), an oxide, nitride, silicon nitride (SiN), silicon oxide ($SO_2$) or other materials including low-k materials. In illustrative embodiments, the gate spacers 114 comprises silicon boron carbide nitride (SiBCN). The gate spacers 114 may be formed using a deposition process, such as chemical vapor deposition (CVD), and/or an anisotropic reactive-ion etching (RIE) process. The gate spacers 114 may be present on the sidewalls of the dummy gates 106, and may have a wall thickness ranging from about 3 nanometers (nm) to about 15 nanometers (nm).

As best depicted in FIG. 2, the sacrificial nanosheets 108 of the nanosheet stacks 104 are recessed to remove portions of the nanosheet stack 104 that extend beyond the gate spacer 114. In illustrative embodiments, one or more etching processes are used including, for example, an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In addition, or in conjunction therewith, the lateral exposed surfaces of the sacrificial nanosheets 108 are subjected to an etch process, for example, a lateral hydrogen chloride (HCl) gas isotropic etch process, or an aqueous etch comprising hydrogen peroxide and ammonia, selective to the channel nanosheets 110, to create a plurality of lateral etches or undercut etches within sacrificial nanosheets 108. A conformal dielectric layer (not shown) over the semiconductor structure 100 includes at least the nanosheet stack 104. The conformal dielectric layer fills the recesses in the sacrificial nanosheets 108 to form inner spacers 116 in the recesses of the sacrificial nanosheets 108 between the channel nanosheets 110. The inner spacers 116 may comprise silicon nitride, SiBCN, SiOCN, SiOC, etc. and formed by atomic layer deposition (ALD) processes followed with an isotropic etch process to remove the inner spacer liner material outside the recesses.

Source and drain (S/D) regions 118 are formed using an epitaxial layer growth process on the sidewalls of the nanosheet stacks 104. In illustrative embodiments, the source/drain regions 118 comprises epitaxial growth of silicon germanium (SiGe) similar to the material of the sacrificial nanosheets 108. Alternatively, the source/drain regions 118 may include epitaxial growth of silicon. The epitaxial growth or layers may provide at least a portion of the source/drain regions 118 of the semiconductor structure 100. As used herein, the term "drain" means a doped region in semiconductor structure located at the end of the channel region, in which carriers are flowing out of the semiconductor structure 100, e.g., nanosheet transistor structure, through the drain. The term "source" is a doped region in the semiconductor structure, in which majority carriers are flowing into the channel region. The source/drain regions 118 can be formed by in-situ doping (doping during epitaxy) or ex-situ, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the source/drain regions 118 may be carried out in a chemical vapor deposition apparatus, such as a metal organic chemical vapor deposition (MOCVD) apparatus or a plasma enhanced chemical vapor deposition (PECVD) apparatus. The epitaxial semiconductor source/drain regions 118 may be in situ doped to a p-type or n-type conductivity. The term "in situ" denotes that a dopant, e.g., p-type or n-type dopant, is introduced to the base semiconductor material, e.g., silicon or silicon germanium, during the formation of the base material. In one illustrative embodiment, for a p-type conductivity, boron p-type dopants are introduced into the epitaxial growth of silicon germanium and, for an n-type conductivity, phosphorous n-type dopants are introduced into the epitaxial growth of silicon.

The semiconductor structure further includes a BDI layer 120 over the semiconductor substrate 102 fabricated in the manner described hereinabove. For example, in illustrative embodiments, after initial processing, a sacrificial bottom isolation layer of silicon germanium (SiGe), e.g., (55% germanium) is formed on top of the substrate 102. The sacrificial bottom isolation layer can be epitaxially grown. After forming the sacrificial bottom isolation layer, the nanosheet stack 104 is formed. The sacrificial bottom isolation layer is a material that can be removed (i.e., etched) without etching the layers in the nanosheet stack 104. That is, the sacrificial bottom isolation layer can be etched/removed without removing the sacrificial nanosheets 108 and the channel nanosheets 110. Once removed, the vacated space is filled with a dielectric isolator material to form the BDI layer 120. Shallow trench isolation (STI) regions 122 are formed within the substrate 102 between the nanosheets stacks 104 to electrically isolate the stacks 104. The (STI) regions 122 may be formed during an earlier stage of fabrication.

Figure 4:
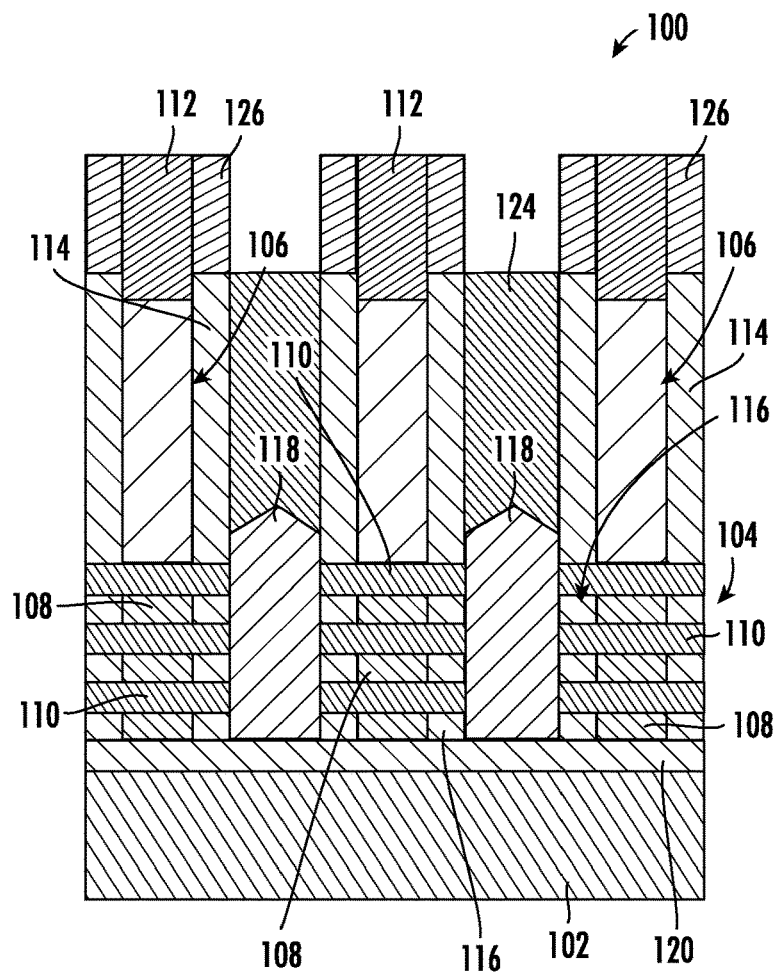
FIG. 4 is a cross-sectional view of the semiconductor structure similar to the view of FIG. 2 at a second intermediate stage of fabrication according to one or more illustrative embodiments.
Figure 5:
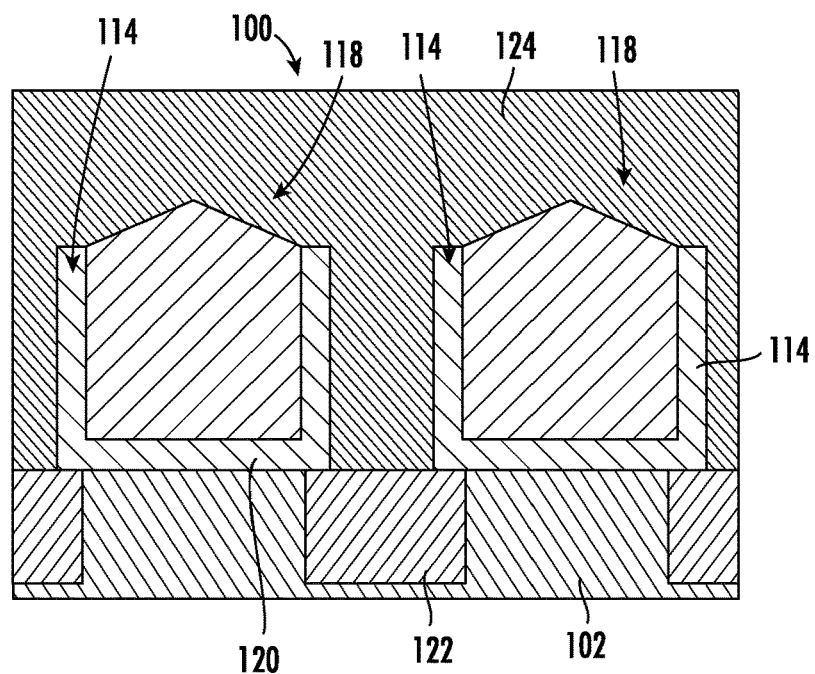
FIG. 5 is a cross-sectional view of the semiconductor structure taken similar to the view of FIG. 3 at the second intermediate stage of fabrication according to one or more illustrative embodiments.

Referring now to FIGS. 4 and 5, in a next or second intermediate stage of fabrication of the semiconductor structure 100, an organic planarizing layer (OPL) 124 is deposited on the semiconductor structure 102. The OPL layer 124 is formed using known organic materials and techniques. For example, the OPL layer 124 may comprise a resin material that is applied by spin coating and baked to enhance planarization. The OPL layer 124 may comprise a liquid monomer that is applied by spin coating. The OPL layer 124 is then recessed to reveal top portions of the gate spacers 114 while keeping the spacers 114 along the sidewalls of the source/drain regions 118 along the y-axis fully covered or encompassed by the OPL layer 124. The portions of the gate spacers 114 around the hard mask layers 112 are removed via one or more etching processes selective to the material of the OPL layer 124. Thereafter, a protective spacer 126 is formed about the upper portion of the hard mask layer 112 in place of the removed portions of the gate spacer 114. The protective spacers 126 may be fabricated from a material that is different than gate spacers 114, such as silicon dioxide (SiO2) or silicon carbide (SiC), and formed via known deposition and etching processes.

Figure 6:
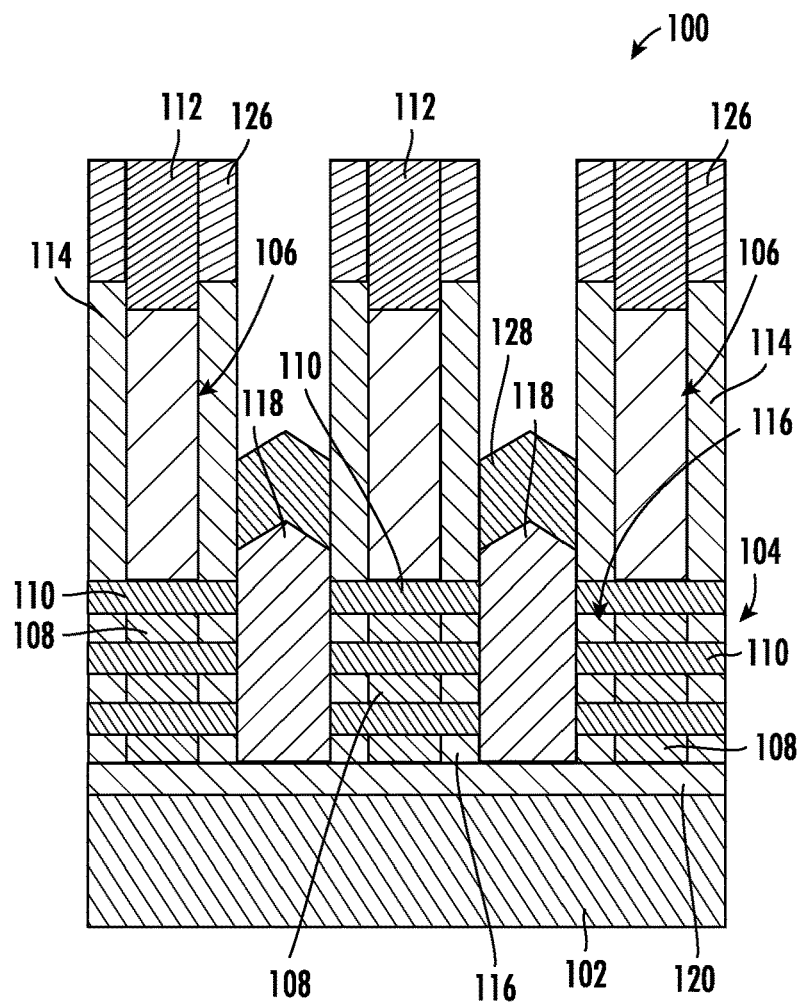
FIG. 6 is a cross-sectional view of the semiconductor structure similar to the view of FIG. 4 at a third intermediate stage of fabrication according to one or more illustrative embodiments.
Figure 7:
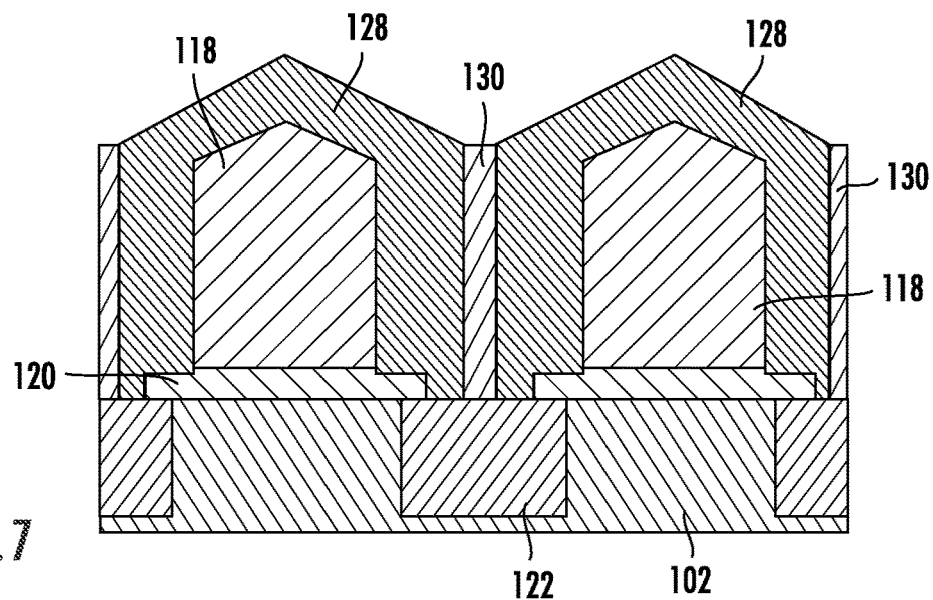
FIG. 7 is a cross-sectional view of the semiconductor structure taken similar to the view of FIG. 5 at the third intermediate stage of fabrication according to one or more illustrative embodiments.

Referring now to FIGS. 6 and 7, in a third intermediate stage of fabrication of the semiconductor structure 100, the OPL layer 124 is removed via one or more removal processes including, for example, an ash etching process. The etching material can be an oxygen ash or a nitrogen or hydrogen-based chemistry including, e.g., nitrogen gas or hydrogen gas, or a combination thereof. The ash etching process removes the organic planarization layer (OPL) 124 with little or no gouging of the underlying components of the semiconductor structure 100. Following removal of the OPL layer 124, the spacer 114 at the sidewalls of the source/drain regions 118 is pulled down by an anisotropic dry etch process. The gate spacer 114 won't be damaged because it is protected by the protective spacer 126.

Thereafter, a second sacrificial layer 128 is selectively deposited on the source/drain regions 118. In illustrative embodiments, the second sacrificial layer 128 includes a silicon (Si) material and/or silicon germanium (SiGe) material epitaxially grown in the manner described hereinabove. In other illustrative embodiments, the second sacrificial material comprises titanium (Ti). In addition, one or more isolator pillars 130 are formed between the nanosheet stacks 104. The isolator pillars 130 may include any suitable insulator material such as silicon dioxide (SiO2), silicon carbide (SiC), silicon oxycarbide (SiOC), and silicon nitride (SiN), and deposited via known deposition techniques. The isolator pillars 130 extend to a predetermined vertical height at least vertically above the eventual configuration of the source/drain regions 118.

Figure 8:
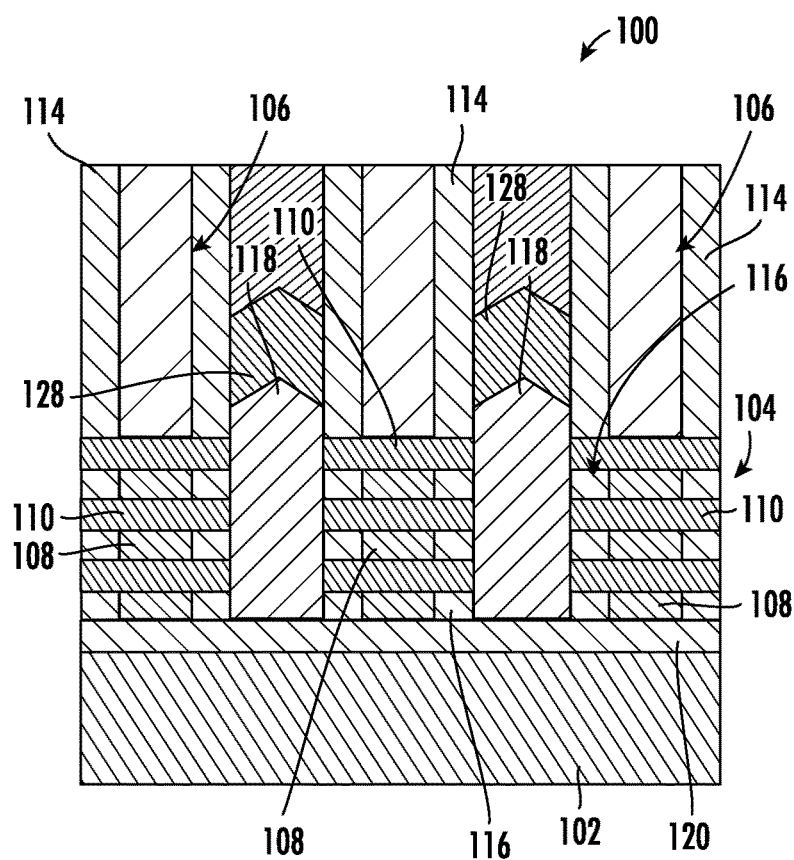
FIG. 8 is a cross-sectional view of the semiconductor structure similar to the view of FIG. 6 at a fourth intermediate stage of fabrication according to one or more illustrative embodiments.
Figure 9:
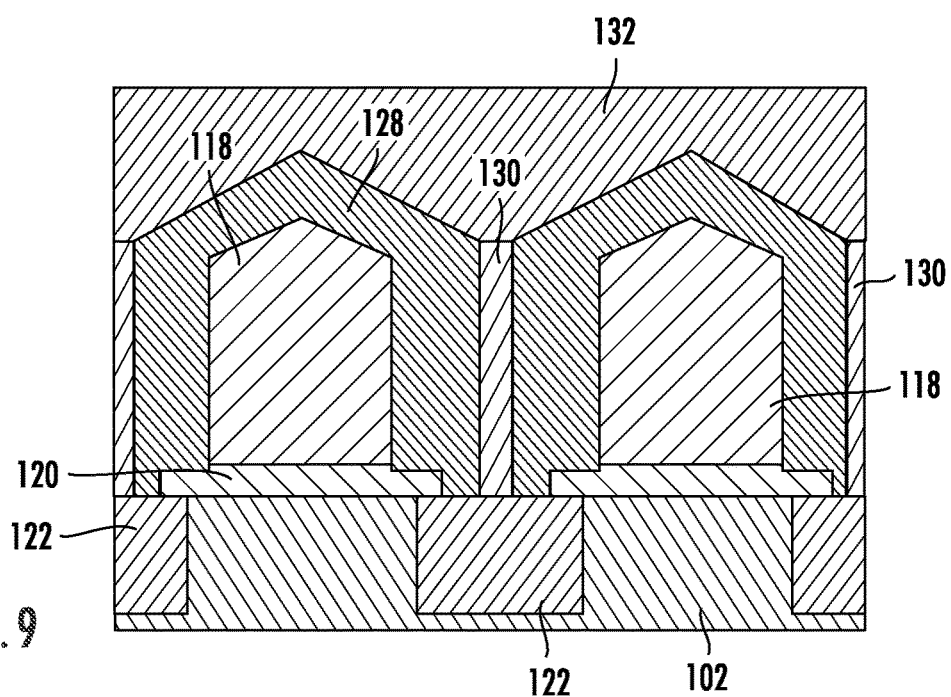
FIG. 9 is a cross-sectional view of the semiconductor structure taken similar to the view of FIG. 7 at the fourth intermediate stage of fabrication according to one or more illustrative embodiments.

Referring now to FIGS. 8 and 9, illustrating a fourth intermediate stage of fabrication of the semiconductor structure 100, an inter-layer dielectric (ILD) 132 is deposited onto the semiconductor substrate 102 to at least partially encompass the source/drain regions 118, the second sacrificial layer 128, and the dummy gates 106 with gate spacers 114. Suitable dielectric materials for forming the inter-layer dielectric (ILD) 132 include but are not limited to, silicon oxide (SiO), silicon nitride (SiN), silicon oxynitride (SiON), silicon oxycarbide (SiCO), SiCON, or any suitable combination of such materials. In illustrative embodiments, the inter-layer dielectric (ILD) 132 comprises a thin layer of conformal silicon nitride (SiN) followed an oxide layer. In various embodiments, a height of the inter-layer dielectric (ILD) 132 can be reduced by chemical-mechanical polishing (CMP). Thereafter, the protective spacer 126 and the hard mask layer 112 above the dummy gates 106 are removed via one or more etching processes selective to the gate spacers 114 and/or the inter-layer dielectric (ILD) 132.

Figure 10:
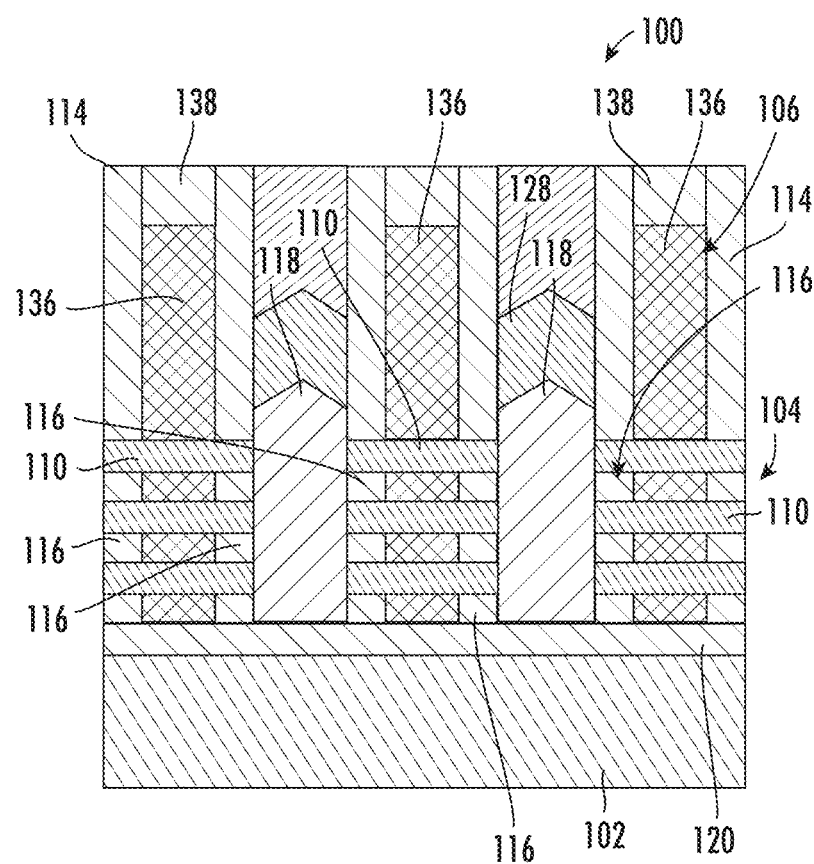
FIG. 10 is a cross-sectional view of the semiconductor structure similar to the view of FIG. 8 at a fifth intermediate stage of fabrication according to one or more illustrative embodiments.
Figure 11:
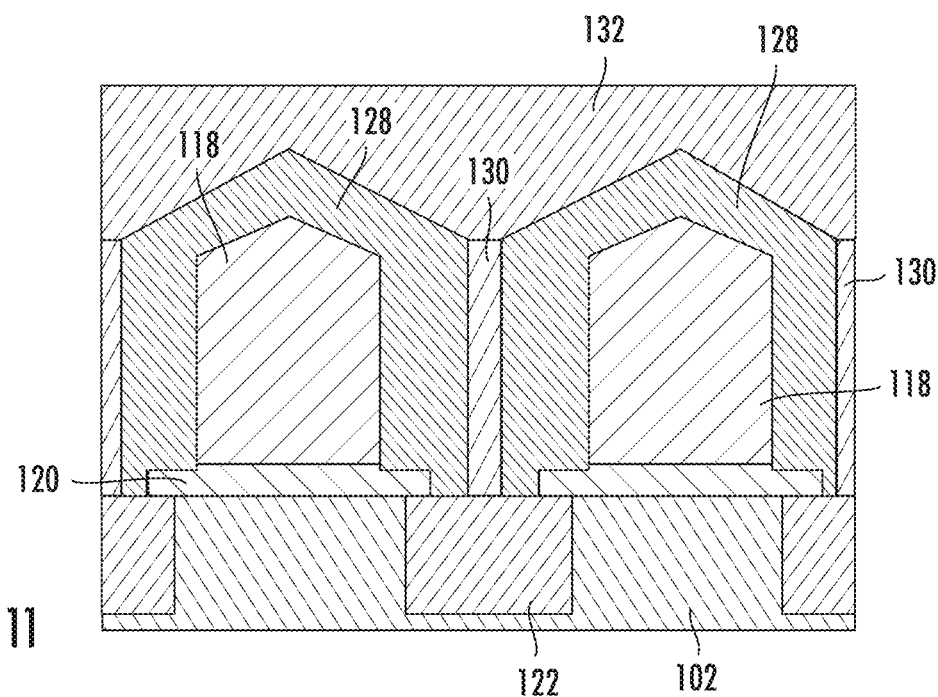
FIG. 11 is a cross-sectional view of the semiconductor structure taken similar to the view of FIG. 9 at the fifth intermediate stage of fabrication according to one or more illustrative embodiments.

With reference to FIGS. 10 and 11, illustrating a fifth intermediate stage of fabrication of the semiconductor structure 100, the dummy gates 106 are removed using a wet or dry etch process. In one example, the etch process for removing the dummy gates 106 can include an etch chemistry selective to the material layers of the nanosheet stack 104. Following removal of the dummy gates 106, the sacrificial nanosheets 108 comprising silicon germanium (SiGe) are also removed thereby releasing the channel nanosheets 110. The silicon channel nanosheets 110, once released from the silicon germanium sacrificial nanosheets 108, will form the nanosheet channels of the semiconductor structure 100 or nanosheet transistor structure. In this example, following removal of one of the sacrificial nanosheets 108, a suspended channel structure is provided. By "suspended channel" it is meant that the channel nanosheets 110 are present overlying the substrate 102. The sidewalls of the channel nanosheets 110 are supported, e.g., anchored by the inner spacers 116.

The process is continued by forming a high-k/metal gate structure 136 around the channel nanosheets 110 and within the void left by removal of the dummy gates 106 in each nanosheet stack 104. For example, a high-k dielectric material can be deposited to form a gate dielectric. The gate dielectric can be formed on the entirety of the exterior surface of the suspended channel nanosheets 110. Example of high-k dielectric includes hafnium oxide (HfO2), zirconium dioxide (ZrO2), hafnia aluminate (HfAlOx), hafnia lanthanum aluminate (HfLaOx), etc. Thereafter, a gate conductor material is deposited onto the semiconductor structure. The gate conductor material can comprise any suitable conductive metal material. The conductive material may further comprise dopants that are incorporated during or after deposition. The gate conductor material can be deposited by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. Examples of gate conductor materials includes work function metals (WFM) such as titanium nitride (TiN), titanium aluminide (TiAl), titanium carbide (TIC), titanium aluminum carbide (TiAlC), etc., and gate fill metals such as tungsten (W), aluminum (Al), etc. After the deposition of the high-k dielectric material and the gate conductive metal, the upper portion of the high-k gate structures 136 can be recessed. Self-aligned contact (SAC) caps 138 are disposed over the high-k gate structures 136. The SAC caps 138 may be formed of a material resistant to an etch chemistry used for ILD 132. In one embodiment where ILD 132 includes silicon dioxide (SiO2), the SAC caps 138 may include silicon nitride (SiN), siliconborocarbonitride (SiBCN), silicon oxycarbide (SiCO), or silicon oxycarbonitride (SiOCN).

Figure 12:
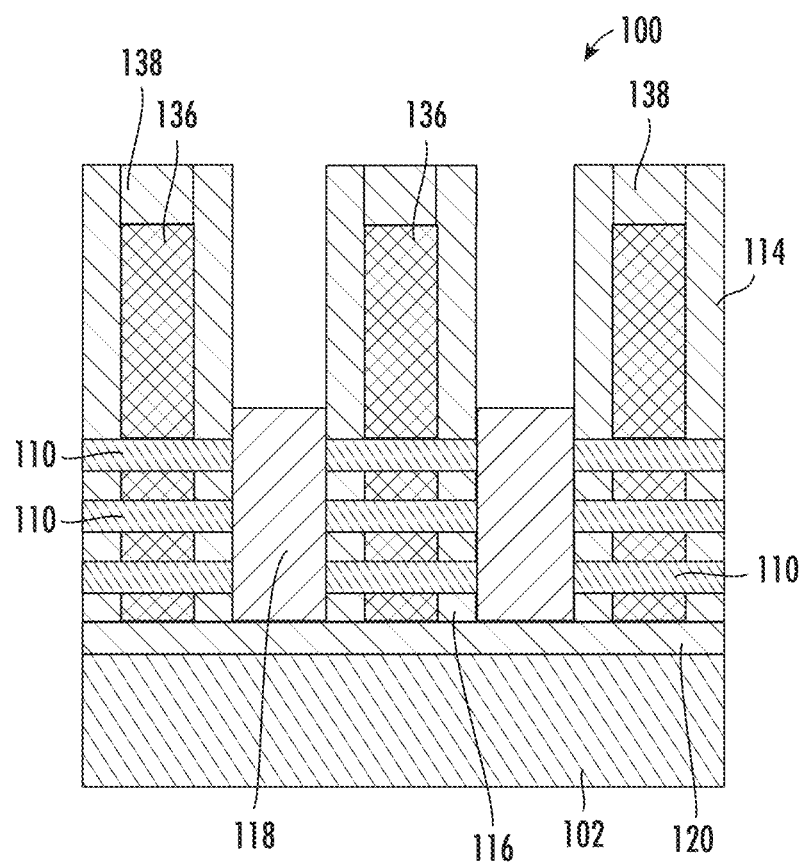
FIG. 12 is a cross-sectional view of the semiconductor structure similar to the view of FIG. 10 at a sixth intermediate stage of fabrication according to one or more illustrative embodiments.
Figure 13:
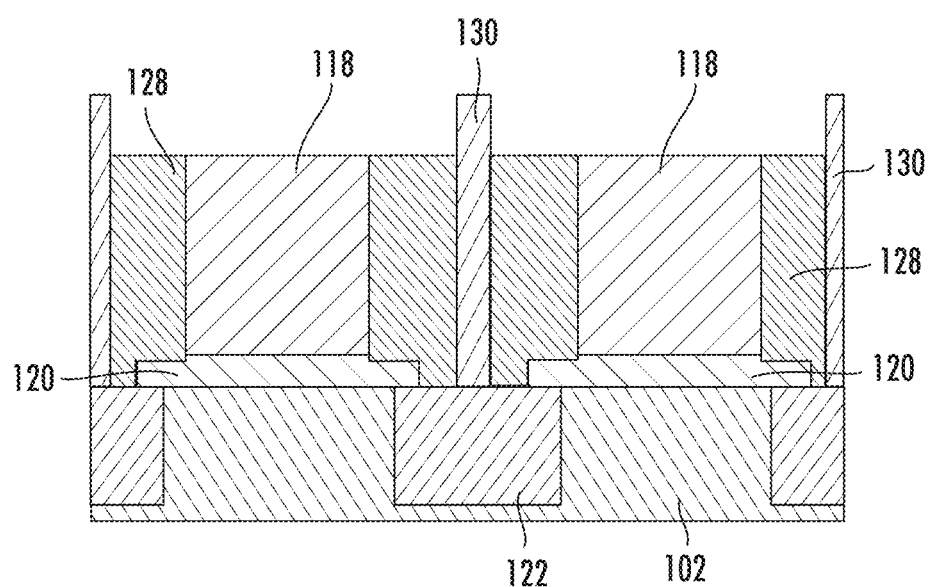
FIG. 13 is a cross-sectional view of the semiconductor structure taken similar to the view of FIG. 11 at the sixth intermediate stage of fabrication according to one or more illustrative embodiments.

Referring now to FIGS. 12 and 13, illustrating a sixth intermediate stage of fabrication of the semiconductor structure 100, the process is continued by removing the ILD 132, via any etch process selective to the material of the SAC caps 138 and the gate spacers 114, and capable of removing the oxide material of the ILD 132. In addition, the second sacrificial layer 128 and the source/drain regions 118 are recessed, via one or more etching process, to a position beneath the isolator pillars 130. Any suitable etching processes selective to the material of the isolator pillars 130 and the gate spacers 114 are envisioned.

Figure 14:
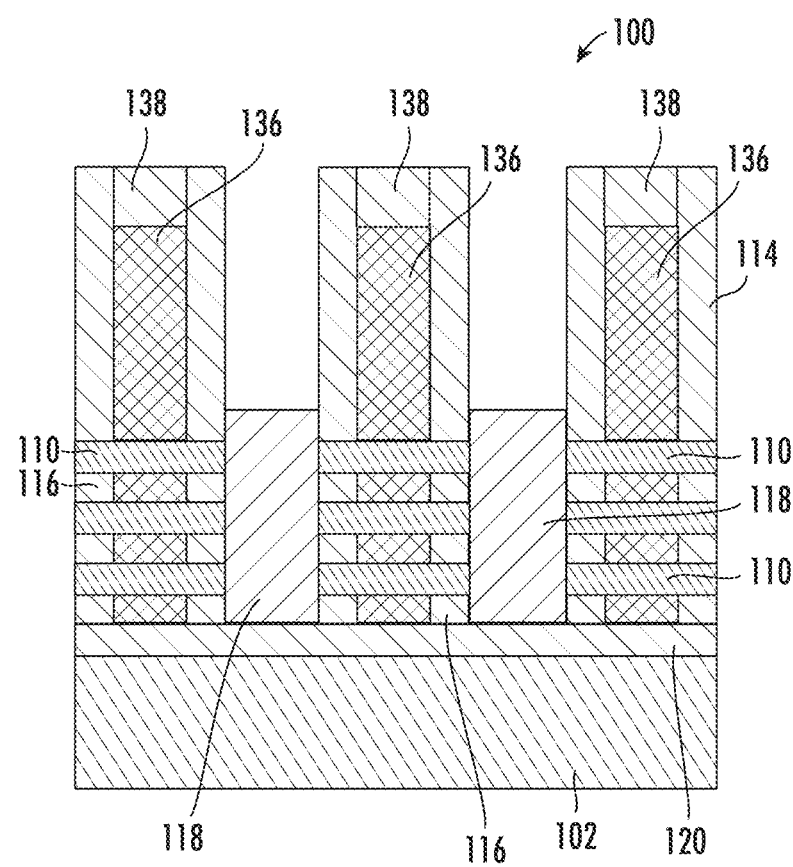
FIG. 14 is a cross-sectional view of the semiconductor structure similar to the view of FIG. 12 at a seventh intermediate stage of fabrication according to one or more illustrative embodiments.
Figure 15:
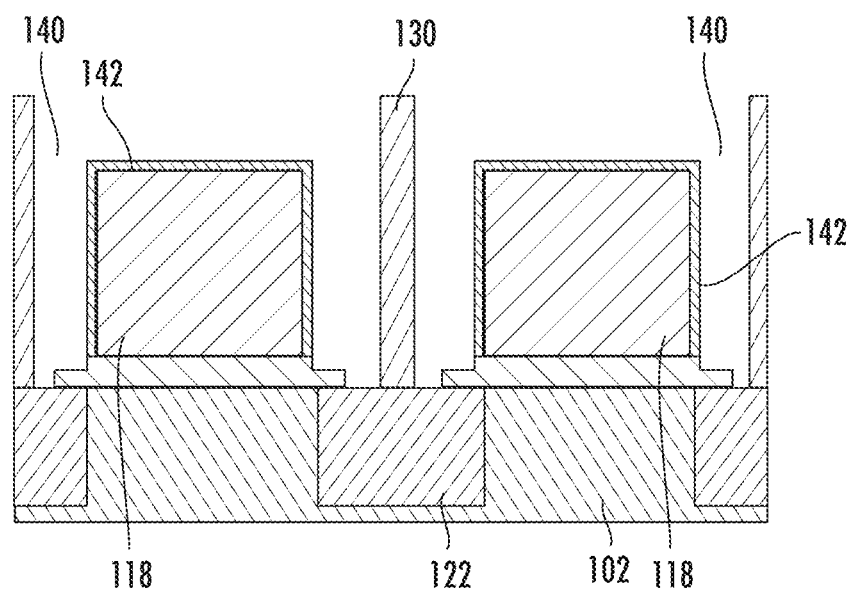
FIG. 15 is a cross-sectional view of the semiconductor structure taken similar to the view of FIG. 13 at the seventh intermediate stage of fabrication according to one or more illustrative embodiments.

Referring now to FIGS. 14 and 15, illustrating a seventh intermediate stage of fabrication of the semiconductor structure 100, the second sacrificial layer 128 is completely removed from the semiconductor structure 100. In one embodiment, the second sacrificial layer 128 is removed by an etch process selective to the materials of the isolator pillars 130 and the source/drain regions 118. Subsequent to removal of the second sacrificial layer 128, a gap or void 140 is formed about the source/drain regions 118.

Figure 16:
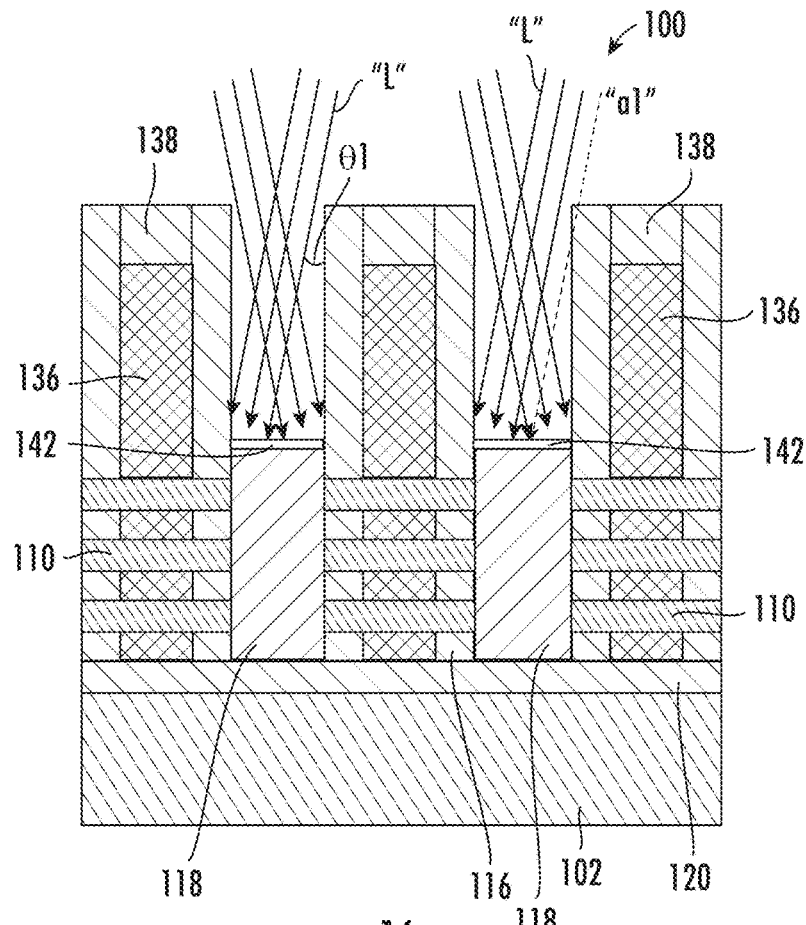
FIG. 16 is a cross-sectional view of the semiconductor structure similar to the view of FIG. 14 at an eighth intermediate stage of fabrication according to one or more illustrative embodiments.
Figure 17:
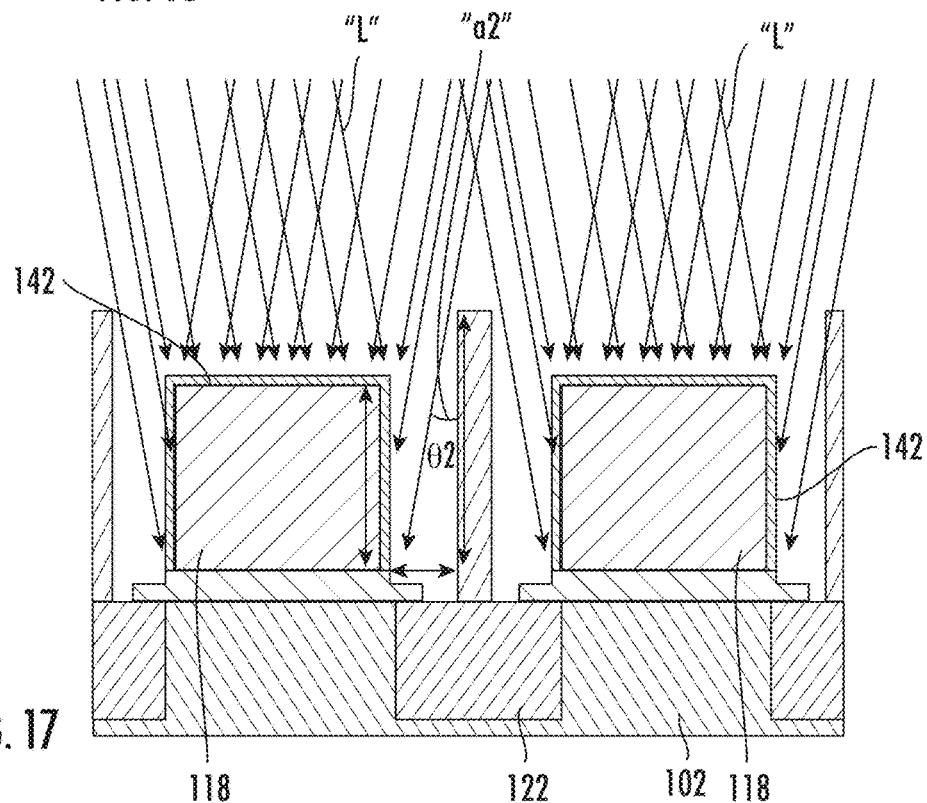
FIG. 17 is a cross-sectional view of the semiconductor structure taken similar to the view of FIG. 15 at the eighth intermediate stage of fabrication according to one or more illustrative embodiments.

With reference now to FIGS. 16 and 17, illustrating an eighth intermediate stage of fabrication of the semiconductor structure 100, a pre-amorphization implantation process is performed over the epitaxial surfaces of the source/drain regions 118 such that an amorphous semiconductor layer 142 is formed on the source/drain regions 118. The pre-amorphization implantation can be formed by implantation (represented by directional arrows "L") of high-Z ions, where $z >= 14$, e.g., by neutrals Si, Ge, Ar, Xe. The amorphous layer 142 has a thickness ranging from about 3-10 nanometers (nm). Thereafter, additional n-type or p-type dopants such as P. As, Ga or boron can be implanted over the epitaxial material and/or surfaces of the source/drain regions 118 depending on polarity of the intended device. The implantation angle "α1" is about 8.5° along the x-axis and the implantation angle "α2" is about 15.6° along the y-axis. Other angles are also contemplated. The implantation process will ensure a heavily doped surface region being formed at epitaxial surface of the source/drain regions 118 such that later a high-quality silicide with low contact resistance can be formed over the source/drain regions 118.

Figure 18:
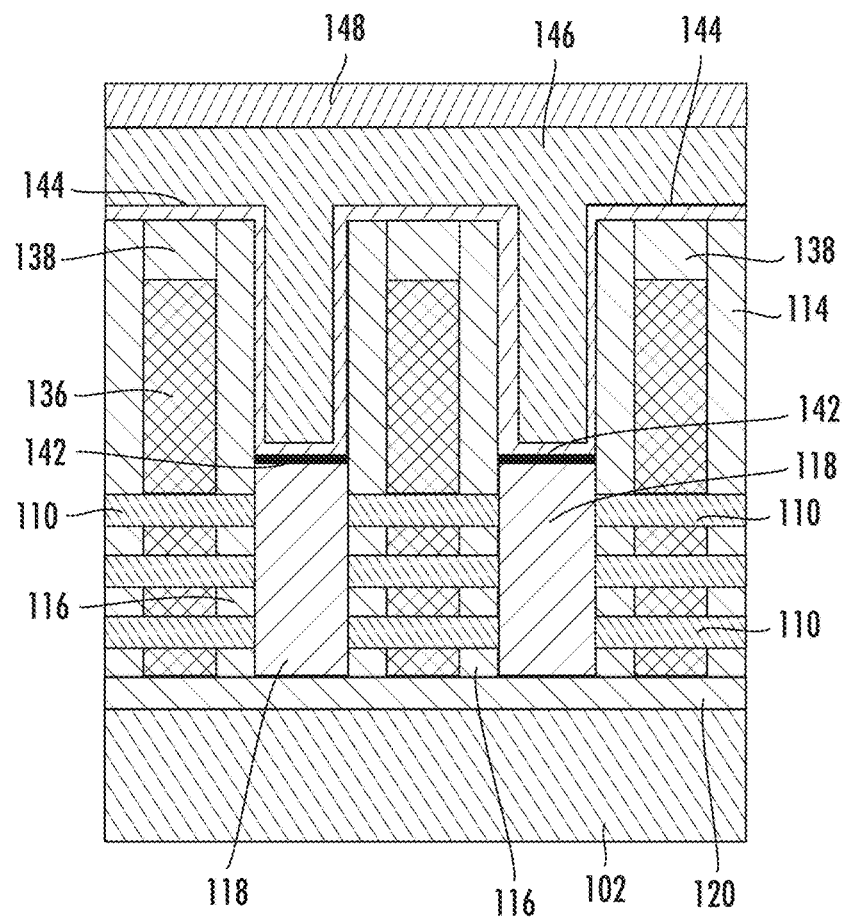
FIG. 18 is a cross-sectional view of the semiconductor structure similar to the view of FIG. 16 at a ninth intermediate stage of fabrication according to one or more illustrative embodiments.
Figure 19:
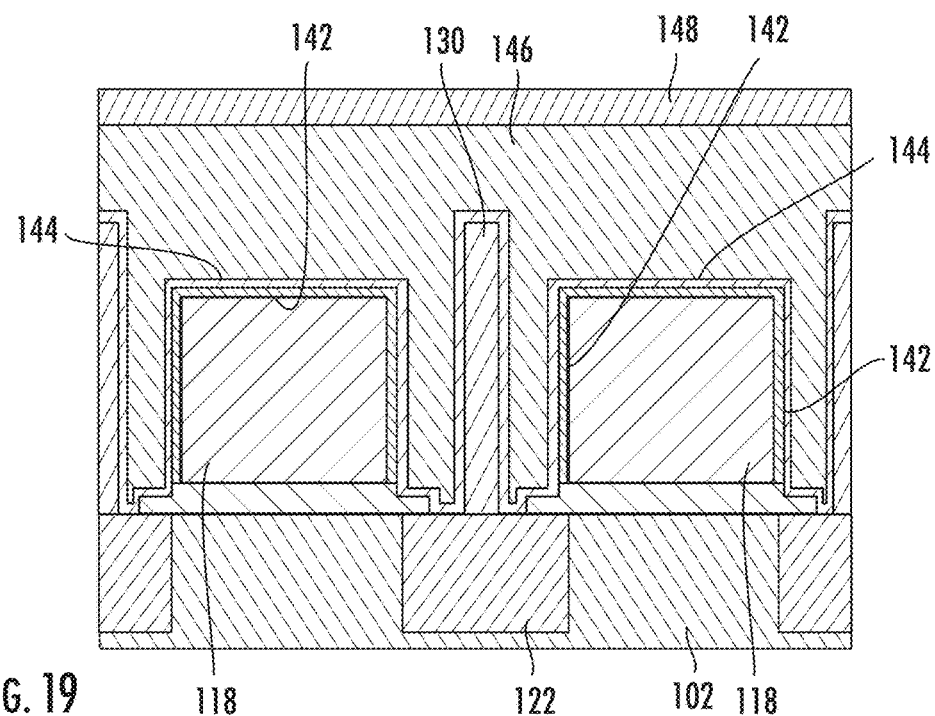
FIG. 19 is a cross-sectional view of the semiconductor structure taken similar to the view of FIG. 17 at the ninth intermediate stage of fabrication according to one or more illustrative embodiments.

Referring now to FIGS. 18 and 19, illustrating a ninth intermediate stage of fabrication of the semiconductor structure 100, a liner 144, for example, a metal-based silicide liner 144, is formed on the semiconductor structure 100. The material of the metal-based silicide liner 144 may be deposited via known deposition techniques with or without an optional silicidation anneal. The thin metal-based silicide liner 144 may include titanium (Ti), platinum-doped nickel (NiPt), NiPtTi alloy, platinum (Pt), titanium aluminide (TiAl), or titanium carbide (TIC). The thin metal-based liner 144 forms a silicide with the semiconductor material on which it is deposited. Thereafter, a fill layer 146 is deposited through known deposition techniques onto the semiconductor structure 100. The fill layer 146 may comprise ruthenium (Ru). Other materials for the fill layer 146 include tungsten (W), cobalt (Co) or copper (Cu). The fill layer 146 may be subject to a planarization process. The metal-based silicide liner 144 and the fill layer 146 form the wrap-around contact, the details of which will be discussed hereinbelow. A hard mask layer 148 is thereafter deposited onto the fill layer 146.

Figure 20:
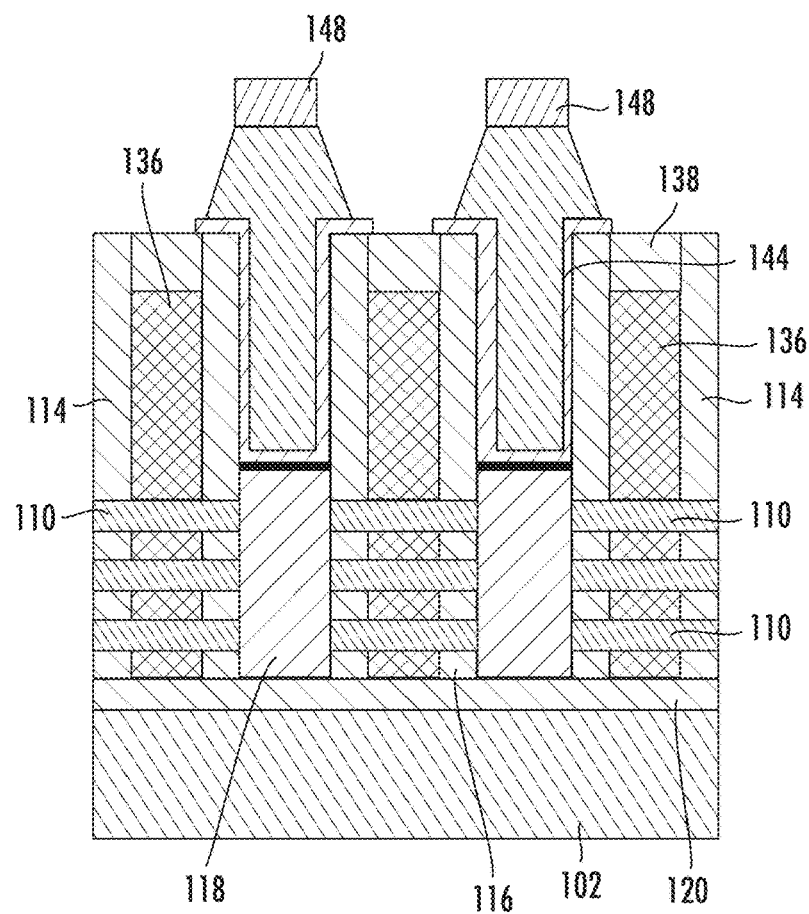
FIG. 20 is a cross-sectional view of the semiconductor structure similar to the view of FIG. 18 at a tenth intermediate stage of fabrication according to one or more illustrative embodiments.
Figure 21:
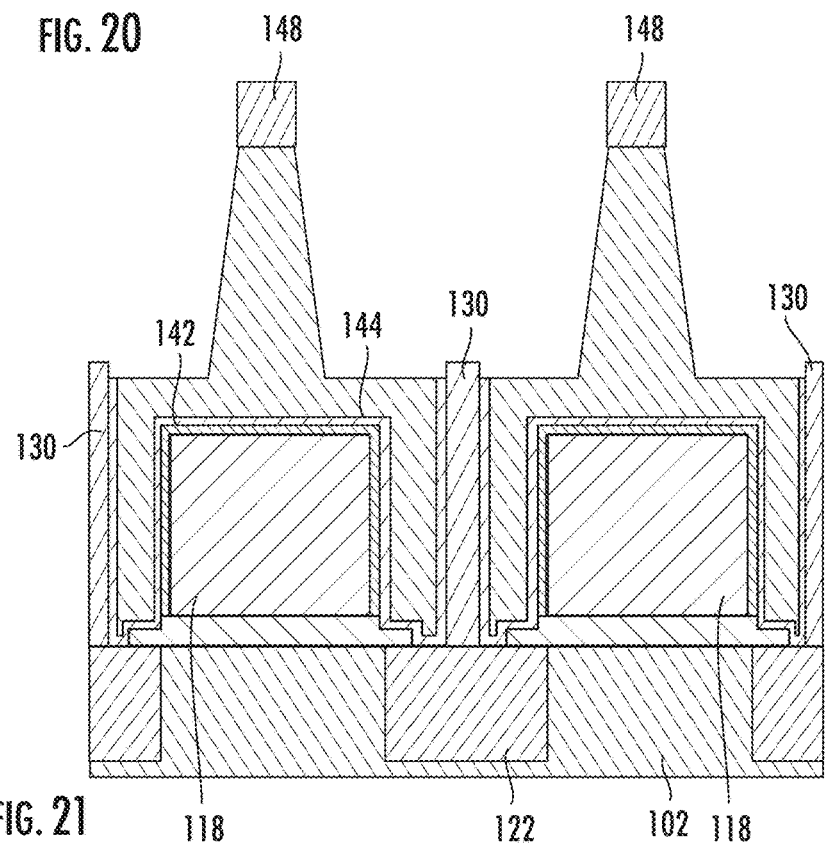
FIG. 21 is a cross-sectional view of the semiconductor structure taken similar to the view of FIG. 19 at the tenth intermediate stage of fabrication according to one or more illustrative embodiments.

With reference now to FIGS. 20 and 21, illustrating a tenth intermediate stage of fabrication of the semiconductor structure 100, via known lithographic processes including, for example, an extreme ultraviolet (EUV) mask process, the hard mask layer 148 is patterned to protect the components where the contacts for the source/drain regions 118 will be formed. The hard mask layer 148 and the fill layer 146 are subjected to one or more etching processes to remove the hard mask layer 148 and the fill layer 146 with the exceptions of the remaining hard mask layer 148 and the fill layer 146 above the source/drain regions 118 and the nanosheet stacks 104. The etch depth is deep enough such that isolator pillar 130 is revealed.

Figure 22:
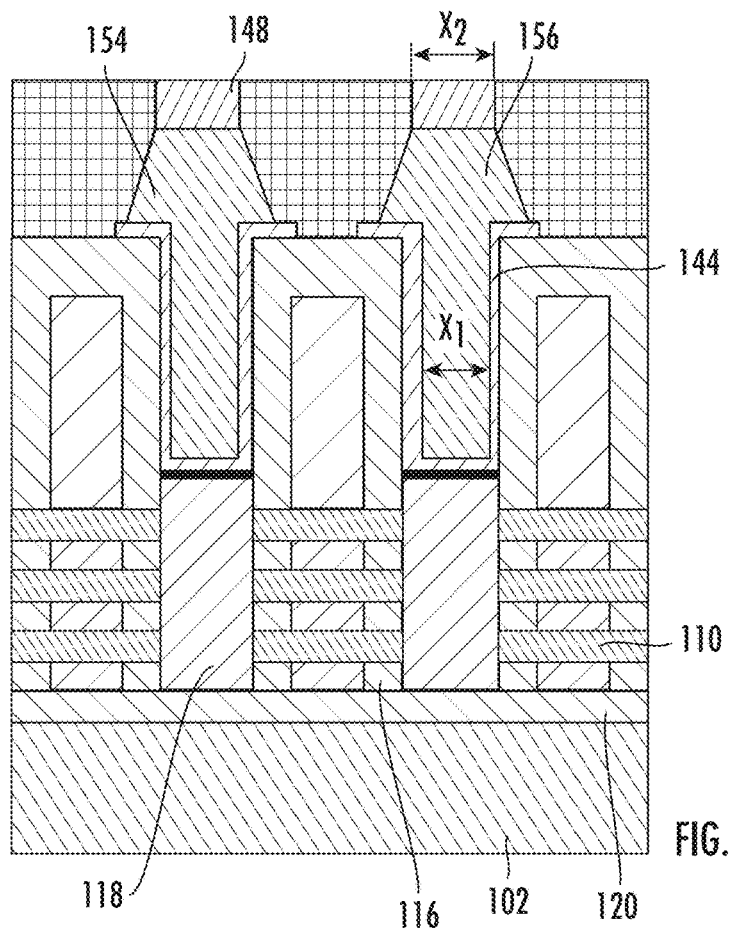
FIG. 22 is a cross-sectional view of the semiconductor structure similar to the view of FIG. 20 at an eleventh intermediate stage of fabrication according to one or more illustrative embodiments.
Figure 23:
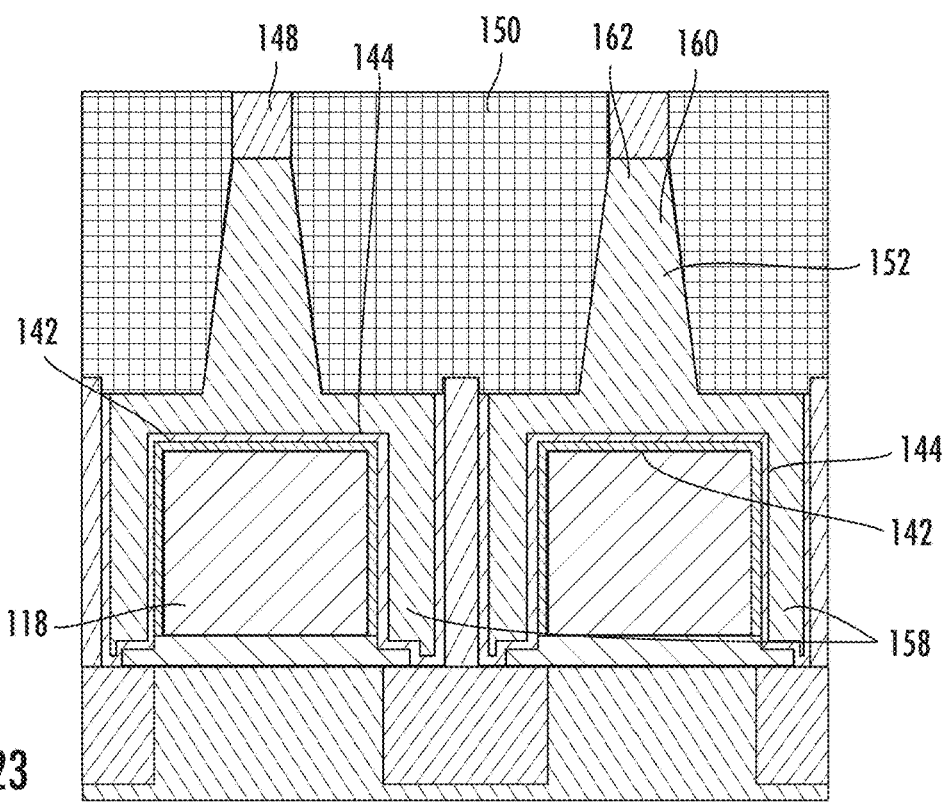
FIG. 23 is a cross-sectional view of the semiconductor structure taken similar to the view of FIG. 21 at the eleventh intermediate stage of fabrication according to one or more illustrative embodiments.

Referring now to FIGS. 22 and 23, illustrating an eleventh intermediate stage of fabrication of the semiconductor structure 100, a low-k dielectric fill is deposited on the semiconductor structure and subjected to a chemical-mechanical polishing (CMP) process to form a low k dielectric layer 150 on the semiconductor structure 100.

Thus, the semiconductor structure depicted in FIGS. 22 and 23 includes a wrap-around contact 152 having the following features. In the following discussion, the wrap-around contact 152 will be described as having various portions or segments; however, the wrap-around contacts 152 are identical. The different segments or portions identified in FIGS. 22 and 23 along the x and y axes, respectively, are identified for clarity. Along the x-direction depicted in FIG. 22, the wrap-around contact 152 includes a lower contact portion 154 defining a first x dimension "x1" and an upper contact portion 156 defining a second x dimension "x2." The "x1" dimension may be constant along its length. The second dimension "x2" of the upper contact portion 156 is generally tapered and varies along its length. More specifically, the second dimension "x2" is greater than the "x1" dimension adjacent the lower contact portion 154 and gradually reduces in dimension at locations remote from the lower contact portion 154 (i.e., defines a negative angle or negative taper). The lower contact portion 154 is in contact with the metal-based silicide liner 144 along the x-axis, i.e., the lower contact portion 154 extends between gate spacers 114 of adjacent gate structures and contacts the metal-based silicide liners 144 on the adjacent gate spacers 114. Along the y-axis depicted in FIG. 23, the wrap-around contact 152 includes a lower contact portion 158 disposed about the source/drain regions 118, a second middle contact portion 160 and a third upper contact portion 162. The second middle contact portion 160 terminates adjacent the upper surfaces of the SAC caps 138 (FIG. 22) and the third upper portion extends beyond the upper surface of the SAC caps 138 to the hardmask layer 148. The lower contact portion 158 is in contact with the metal-based silicide liner 144 along the y-axis as shown in FIG. 23. The second middle contact portion 160 and the third upper contact portion 162 are devoid of the metal-based silicide liner 144 and directly contact the low-k dielectric layer 150. The second middle contact portion 160 and the third upper contact portion 162 may define a continuous taper. By forming the warp-around contact with this configuration, the contact area with the epitaxial material of the source/drain regions 118 is maximized while minimizing contact metal to gate capacitance and reducing contact resistance through, for example, removal of a sidewall metal liner along the y-axis. In addition, the isolator pillar 130 extends vertically above the lower contact portions 158 and the source/drain regions 118 of adjacent structures thereby further isolating these components, enhancing functionality and minimizing capacitance and/or inductance leakage.

Following the formation of the semiconductor structure 100 shown in FIGS. 22 and 23, any known sequence of processing steps can be implemented to complete the fabrication of the FET device, the details of which are not needed to understand embodiments of the disclosure. Following formation of the gate contacts, a BEOL (back end of line) interconnect structure may be formed to provide connections to/between the FET device and other active or passive devices that are formed as part of the FET layer.

In some embodiments, the above-described techniques are used in connection with manufacture of semiconductor integrated circuit devices that illustratively comprise, by way of non-limiting example, CMOS devices, MOSFET devices, FinFET devices, planar FET devices and/or other types of semiconductor integrated circuit devices that incorporate or otherwise utilize CMOS, MOSFET, and/or FinFET technology.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, the suspended nanosheets channel structures may be further processed to provide nanowires. For example, a nanowire geometry can be produced from the suspended channel structures using etch processing, such as isotropic etch processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, which comprises:
    a substrate defining a first axis and a second axis in orthogonal relation to the first axis;
    first and second nanosheet stacks disposed on the substrate;
    a gate structure on each of the first and second nanosheet stacks;
    a source/drain region adjacent each of the first and second nanosheet stacks;
    a wrap-around contact disposed about each source/drain region and comprising:
        a first contact portion enclosing a top surface and sidewalls of the source/drain region along the second axis;
        a second contact portion disposed between the gate structures on the first axis and a first dielectric layer on the second axis; and
        a third contact portion disposed in the first dielectric layer and underlapping a second dielectric layer; and
    an isolator pillar disposed between respective ones of the first contact portions of adjacent wrap-around contacts;
    wherein the first dielectric layer is disposed over the isolator pillar and the gate structures.

2. The semiconductor structure according to claim 1 wherein the second contact portion extends from the first contact portion.

3. The semiconductor structure according to claim 2 wherein the isolator pillar extends vertically above the first contact portion of each wrap-around contact.

4. The semiconductor structure according to claim 1 including a liner disposed over the source/drain region along the second axis of the substrate, the liner comprising a metal-based silicide.

5. The semiconductor structure according to claim 4 wherein the liner is disposed on sides of the isolator pillar.

6. The semiconductor structure according to claim 5 wherein the liner is disposed on the second contact portion of each wrap-around contact along the first axis of the substrate.

7. The semiconductor structure according to claim 6 wherein the gate structure includes a pair of gate spacers and a metal gate at least partially disposed within the gate spacers.

8. The semiconductor structure according to claim 7 wherein the liner is in contact with the gate spacers.

9. The semiconductor structure according to claim 4 including a saturated doped layer surrounding the source/drain region beneath the liner along the second axis of the substrate.

10. The semiconductor structure according to claim 6 wherein the at least the second contact portion of each wrap-around contact tapers in dimension along the second axis of the substrate.

11. The semiconductor structure according to claim 10 wherein the at least the second contact portion of each wrap-around contact is in contact with the first dielectric layer along the second axis of the substrate.

12. The semiconductor structure according to claim 10 wherein the third contact portion extends from the second contact portion.

13. The semiconductor structure according to claim 12 wherein the third contact portion defines a dimension along the first axis greater than a corresponding dimension of the second contact portion along the first axis.

14. A semiconductor structure, which comprises:
    a substrate defining a first axis and a second axis in orthogonal relation to the first axis;
    first and second nanosheet stacks disposed on the substrate;
    a gate structure on each of the first and second nanosheet stacks;
    a source/drain region adjacent each of the first and second nanosheet stacks;
    a wrap-around contact disposed about each source/drain region and comprising:
        a first contact portion enclosing a top surface and sidewalls of the source/drain region along the second axis;
        a second contact portion disposed between the gate structures on the first axis and a first dielectric layer on the second axis; and
        a third contact portion disposed in the first dielectric layer and underlapping a second dielectric layer;
    a liner disposed on portions of the wrap-around contact, the liner comprising a metal-based silicide; and
    an isolator pillar disposed between respective ones of the first contact portions of adjacent wrap-around contacts.

15. The semiconductor structure according to claim 14 wherein the gate structure includes a pair of gate spacers and a metal gate at least partially disposed within the gate spacers.

16. The semiconductor structure according to claim 15 wherein the liner is in contact with the gate spacers of adjacent gate structures.

17. The semiconductor structure according to claim 14, wherein the second contact portion extends from the first contact portion.

18. A method, comprising:
    forming first and second nanosheet stacks on a substrate, the substrate defining a first axis and a second axis in orthogonal relation to the first axis;

forming a gate structure about each of the first and second nanosheet stacks;

forming a source/drain region adjacent each of the first and second nanosheet stacks;

forming a wrap-around contact disposed about each source/drain region, the wrap-around contact comprising:
- a first contact portion enclosing a top surface and sidewalls of the source/drain region along the second axis;
- a second contact portion disposed between the gate structures on the first axis and a first dielectric layer on the second axis; and
- a third contact portion disposed in the first dielectric layer and underlapping a second dielectric layer; and forming an isolator pillar disposed between respective ones of the first contact portions of adjacent wrap-around contacts.

19. The method according to claim 18 wherein the second contact portion extends from the first contact portion.

20. The method according to claim 19 wherein forming the isolator pillar includes extending the isolator pillar above the source/drain regions.

* * * * *